United States Patent
Iwamoto

(10) Patent No.: US 9,240,543 B2
(45) Date of Patent: Jan. 19, 2016

(54) METHOD FOR MANUFACTURING PIEZOELECTRIC DEVICE

(75) Inventor: Takashi Iwamoto, Kusatsu (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1001 days.

(21) Appl. No.: 12/608,115

(22) Filed: Oct. 29, 2009

(65) Prior Publication Data

US 2010/0107388 A1   May 6, 2010

(30) Foreign Application Priority Data

Oct. 31, 2008   (JP) ................................ 2008-282567

(51) Int. Cl.
*H01L 41/313* (2013.01)
*H03H 3/02* (2006.01)
(Continued)

(52) U.S. Cl.
CPC .......... *H01L 41/313* (2013.01); *H01L 41/0933* (2013.01); *H01L 41/0973* (2013.01); *H01L 41/1138* (2013.01); *H01L 41/319* (2013.01); *C23C 8/04* (2013.01); *C23C 8/24* (2013.01); *H01L 41/293* (2013.01); *H03H 3/02* (2013.01); *H03H 2003/021* (2013.01); *H03H 2003/022* (2013.01); *H03H 2003/023* (2013.01);
(Continued)

(58) Field of Classification Search
CPC ............ H01L 41/0933; H01L 41/0978; H01L 41/0973; H01L 41/1138; H01L 41/293; H01L 41/313; H01L 41/319; H03H 3/02; H03H 2003/021; H03H 2003/022; H03H 2003/033; H03H 2003/023; Y10T 29/42; Y10T 29/49005; Y10T 29/49126; Y10T 29/49147; Y10T 29/49155; C23C 8/04; C23C 8/24

USPC ............. 29/25.35, 842, 846, 830, 594; 438/3, 438/29; 204/192.34; 216/33; 310/321, 322, 310/346, 348, 363; 148/317
See application file for complete search history.

(56) References Cited

U.S. PATENT DOCUMENTS 4,551,647 A * 11/1985 Day ......................... Y10T 29/42
5,410,789 A *  5/1995 Noto et al. .................... 29/25.35
(Continued)

FOREIGN PATENT DOCUMENTS

EP    1 667 208 A1    6/2006
EP    1 667 218 A1    6/2006
(Continued)

OTHER PUBLICATIONS

Machine Language Translation of Japanese Patent Publication JP 2000-294754.*

(Continued)

*Primary Examiner* — A. Dexter Tugbang
(74) *Attorney, Agent, or Firm* — Keating & Bennett, LLP

(57) ABSTRACT

In a method for manufacturing an electronic device, an ion implantation layer is formed at a desired depth from one principal surface of a piezoelectric single crystal substrate by implanting hydrogen ions into the piezoelectric single crystal substrate under desired conditions. The piezoelectric single crystal substrate in which the ion implantation layer has been formed is bonded to a supporting substrate, and a piezoelectric thin film is then formed by the application of heat using the ion implantation layer as a detaching interface. This heated detachment is performed at a reduced pressure less than atmospheric pressure and at a heating temperature determined in accordance with the reduced pressure.

16 Claims, 5 Drawing Sheets

(51) Int. Cl.
    *H01L 41/09*      (2006.01)
    *H01L 41/319*      (2013.01)
    *H01L 41/113*      (2006.01)
    *C23C 8/04*      (2006.01)
    *C23C 8/24*      (2006.01)
    *H01L 41/293*      (2013.01)

(52) U.S. Cl.
    CPC ............ *Y10T29/42* (2015.01); *Y10T 29/49005* (2015.01); *Y10T 29/49126* (2015.01); *Y10T 29/49147* (2015.01); *Y10T 29/49155* (2015.01)

(56) References Cited

U.S. PATENT DOCUMENTS

| | | | |
|---|---|---|---|
| 5,666,706 A * | 9/1997 | Tomita et al. | ........... Y10T 29/42 |
| 6,445,265 B1 | 9/2002 | Wright | |
| 6,465,327 B1 | 10/2002 | Aspar et al. | |
| 6,468,366 B1 * | 10/2002 | Katsuda et al. | ............... 148/317 |
| 6,767,749 B2 * | 7/2004 | Kub et al. | ......................... 438/3 |

FOREIGN PATENT DOCUMENTS

| | | |
|---|---|---|
| FR | 2 914 492 A1 | 10/2008 |
| JP | 2000-294754 A | 10/2000 |
| JP | 2002-534886 A | 10/2002 |
| JP | 2003-017967 A | 1/2003 |
| JP | 2010056736 A * | 3/2010 |
| WO | 2005/024917 A1 | 3/2005 |
| WO | 2005/027217 A1 | 3/2005 |

OTHER PUBLICATIONS

Iwamoto, "Method for Manufacturing Piezoelectric Device," U.S. Appl. No. 12/608,113, filed Oct. 29, 2009.

Hayakawa et al., "Method for Producing Piezoelectric Composite Substrate," U.S. Appl. No. 12/608,120, filed Oct. 29, 2009.

Osugi et al., "Single crystal FBAR with LiNbO3 and LiTaO3 piezo-electric substance layers", IEEE, MTT-S International Microwave Symposium, 2007, pp. 873-876.

Official Communication issued in corresponding European Patent Application No. 09173491.3, mailed on Aug. 3, 2011.

Official Communication issued in corresponding Japanese Patent Application No. 2008-282567, mailed on Aug. 31, 2010.

Takashi Iwamoto et al., "Method for Manufacturing Piezoelectronic Device", U.S. Appl. No. 12/608,113, filed Oct. 29, 2009.

Kiyoto Araki et al., "Method for Manufacturing Composite Substrate", U.S. Appl. No. 13/192,500, filed Jul. 28, 2011.

\* cited by examiner

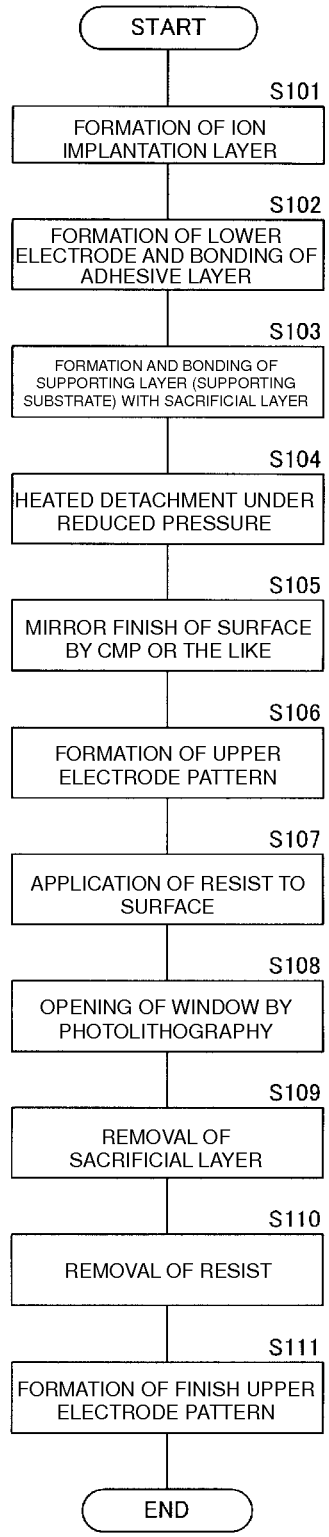

METHOD FOR MANUFACTURING PIEZOELECTRIC DEVICE

BACKGROUND OF THE INVENTION

1. Field of the Invention

The present invention relates to a method for manufacturing an electronic device including a crystalline material, and particularly to a method for manufacturing a thin film piezoelectric single crystal device.

2. Description of the Related Art

Various electronic devices, such as semiconductors and piezoelectric bodies, that include a crystalline material having certain electrical characteristics are currently manufactured and used. Among the various electronic devices, a surface acoustic wave (SAW) device, a film bulk acoustic resonator (F-BAR) device, and other devices are exemplified as a piezoelectric device. Furthermore, many thin film piezoelectric devices obtained by reducing the thickness of a piezoelectric body have been developed as the piezoelectric device because they support high-frequency Lamb wave devices. A method for manufacturing a piezoelectric thin film for forming such a thin film piezoelectric device is disclosed, for example, in Y. Osugi et al.: "Single Crystal FBAR With $LiNO_3$ and $LiTaO_3$", 2007 IEEE MTT-S International Microwave Symposium, pp. 873-876 and Japanese Unexamined Patent Application Publication No. 2002-534886.

The above-mentioned article, "Single Crystal FBAR With $LiNO_3$ and $LiTaO_3$", discloses a deposition method in which a material defining a piezoelectric single crystal, such as AlN or ZnO, is deposited by sputtering or chemical-vapor deposition (CVD) and a polishing method in which a piezoelectric single crystal substrate having a desired thickness is bonded to a supporting substrate and then thinned by polishing.

Japanese Unexamined Patent Application Publication No. 2002-534886 discloses a method called a smart cut method. In the smart cut method, for example, a $LiNO_3$ substrate or a $LiTaO_3$ substrate, particularly a piezoelectric substrate composed of such a material is hereinafter referred to as an LN substrate or an LT substrate, is used as a piezoelectric material and the subsequent processes are performed: (1) an ion implantation layer is formed at a desired depth, where a piezoelectric thin film is to be formed, from the surface of a piezoelectric substrate by implanting ions into the piezoelectric substrate under suitable conditions; and (2) the piezoelectric substrate in which the ion implantation layer has been formed is heated. Through the heating treatment, the piezoelectric thin film is obtained from the piezoelectric substrate using the ion implantation layer as a detaching interface.

However, when the deposition method described above is used, the material is limited to AlN or other suitable material because of, for instance, the film formation temperature or the film formation conditions for obtaining a desired oriented film. Furthermore, since the orientation direction of a crystal axis cannot be controlled, it is difficult to form a crystal in consideration of vibration mode.

When the polishing method described above is used, since the portion other than the piezoelectric thin film is treated as polishing waste, the piezoelectric material is not efficiently used. In addition, it is difficult to form a piezoelectric thin film having a uniform thickness due to polishing conditions, variations in the shape of the original piezoelectric substrate, or other factors, which decreases productivity.

When the smart cut method described above is used, heating is performed in the detachment step. However, since the heating needs to be performed at a high temperature of about 450° C., the following problems arise.

Since the Curie temperature of the piezoelectric substrate is less than the heating temperature, the piezoelectric substrate is heated to a temperature greater than its Curie temperature. As a result, its piezoelectricity deteriorates, and the piezoelectric characteristics of the piezoelectric thin film after detachment are deteriorated.

When an LN substrate or an LT substrate is used as the piezoelectric substrate, oxygen in the piezoelectric substrate diffuses to the outside due to high-temperature heating. Thus, the insulation of the piezoelectric thin film obtained by performing detachment of the piezoelectric substrate near its surface is degraded, and its piezoelectric characteristics are deteriorated.

When an electrode is formed on the surface of the piezoelectric thin film side of the piezoelectric substrate, a metallic element defining the electrode diffuses into the piezoelectric thin film due to high-temperature heating. Consequently, the crystal structure of the piezoelectric thin film is likely to be broken and transmission loss in the piezoelectric thin film is increased.

In the structure in which the piezoelectric thin film is supported by a supporting substrate, the coefficients of linear expansion between the piezoelectric thin film and the supporting substrate need to be as close as possible to each other. Otherwise, breakage is likely to occur at the joint between the piezoelectric thin film and the supporting substrate due to the difference in coefficients of linear expansion during high-temperature heating. This severely limits the materials which can be used for the supporting substrate.

Since the temperature cannot be rapidly increased to the end-point temperature and then rapidly decreased during heating treatment, the higher heating temperature results in longer processing times.

SUMMARY OF THE INVENTION

To overcome the problems described above, preferred embodiments of the present invention provide a method for manufacturing an electronic device that includes a crystalline material such as a piezoelectric device.

According to a preferred embodiment of the present invention, a method for manufacturing an electronic device includes a step of forming an ion implantation layer by implanting ions into a crystalline substrate, and a step of detaching a layer of the crystalline substrate in which the ion implantation layer has been formed to form a crystalline thin film by heating the crystalline substrate, wherein, in the step of detaching a layer of the crystalline substrate to form the crystalline thin film, the crystalline substrate in which the ion implantation layer has been formed is heated at a reduced pressure less than atmospheric pressure and at a heating temperature determined in accordance with the reduced pressure.

In this manufacturing method, detachment is performed at a lower temperature by performing heating at a reduced pressure as compared to the existing case in which detachment is performed by heating at atmospheric pressure ($1.01325 \times 10^5$ Pa). This is because the implanted ions are more easily gasified at a low temperature and a reduced pressure less than at atmospheric pressure, and the difference between the pressures of the ion implantation layer and the crystalline substrate become large at a low temperature, which facilitates cracking and detachment. This means that the detachment is achieved at a lower temperature than in known methods, and the electrical characteristics of the crystalline substrate are prevented from degrading due to high-temperature heating.

According to another preferred embodiment of the present invention, a method for manufacturing a piezoelectric device includes a step of forming an ion implantation layer by implanting ions into a piezoelectric substrate, and a step of detaching a layer of the piezoelectric substrate in which the ion implantation layer has been formed to form a piezoelectric thin film by heating the piezoelectric substrate, wherein, in the step of detaching a layer of the piezoelectric substrate to form the piezoelectric thin film, the piezoelectric substrate in which the ion implantation layer has been formed is heated at a reduced pressure less than atmospheric pressure and at a heating temperature determined in accordance with the reduced pressure.

In this manufacturing method, detachment is performed at a lower temperature by performing heating at a reduced pressure than in the existing case in which detachment is performing by heating at atmospheric pressure ($1.01325 \times 10^5$ Pa). This is because, as described above, the implanted ions are easily gasified at a lower temperature at a reduced pressure than at atmospheric pressure, and the difference between the pressures of the ion implantation layer and the piezoelectric substrate easily becomes large at a low temperature, which facilitates cracking and detachment.

In the piezoelectric substrate, with the stress caused during gasification, an electric discharge occurs around the ion implantation layer due to the charge distribution caused by the pyroelectricity of a piezoelectric single crystal. This electric discharge more easily occurs at a reduced pressure than at atmospheric pressure, and the cracking of the crystal structure around the ion implantation layer is facilitated due to the electric discharge. Consequently, detachment is facilitated. Therefore, the detachment at a temperature lower than in the known method is achieved, and the various characteristics of the piezoelectric substrate are prevented from degrading due to high-temperature heating.

The method for manufacturing a piezoelectric device according to various preferred embodiments of the present invention preferably further includes a step of forming a supporting body on the piezoelectric substrate in which the ion implantation layer has been formed, the supporting body being formed on a side on which the piezoelectric thin film is to be formed using the ion implantation layer, wherein, in the step of detaching a layer of the piezoelectric substrate to form the piezoelectric thin film, the piezoelectric substrate on which the supporting body has been formed is heated at a reduced pressure and at a heating temperature determined in accordance with the reduced pressure.

In this manufacturing method, even if the supporting body that supports the piezoelectric thin film is bonded to the piezoelectric thin film to form a composite substrate, heated detachment at a low temperature as described above can be achieved. Thus, the various characteristics of the piezoelectric thin film that is included in the composite substrate are prevented from degrading due to high-temperature heating.

In the method for manufacturing a piezoelectric device according to various preferred embodiments of the present invention, the piezoelectric substrate preferably has a coefficient of linear expansion different from that of the supporting body.

In this manufacturing method, even if the piezoelectric substrate or piezoelectric thin film has a coefficient of linear expansion different from that of the supporting body, the low heating temperature prevents breakage caused by the different coefficients of linear expansion.

In the method for manufacturing a piezoelectric device according to various preferred embodiments of the present invention, an adhesive layer is preferably formed on the piezoelectric substrate and an adhesive surface of the supporting body is directly bonded to the adhesive layer by surface activated bonding.

In this manufacturing method, since the heating during bonding is not required because of the surface activated bonding, breakages caused by the different coefficients of linear expansion can be more reliably prevented.

In the method for manufacturing a piezoelectric device according to various preferred embodiments of the present invention, the supporting body is preferably formed of a material having good thermal conductivity to the piezoelectric substrate.

In this manufacturing method, the degradation of electrical characteristics described above is prevented by providing a piezoelectric substrate which as good thermal conductivity. Furthermore, a piezoelectric device having good characteristics can be formed.

The method for manufacturing a piezoelectric device according to various preferred embodiments of the present invention preferably further includes, before the step of bonding the piezoelectric substrate to the supporting body, a step of forming an electrode on at least one of a surface of the piezoelectric substrate located on a side on which the piezoelectric thin film is to be formed and a surface of the supporting body to which the piezoelectric substrate is to be bonded.

In this manufacturing method, even if an electrode is in contact with the surface of the piezoelectric thin film, the diffusion of a metal defining the electrode into the piezoelectric thin film is prevented due to the low heating temperature. This prevents an increase in transmission loss in the piezoelectric thin film.

In the method for manufacturing a piezoelectric device according to various preferred embodiments of the present invention, the reduced pressure is preferably set such that the piezoelectricity of the piezoelectric substrate is not significantly deteriorated at the heating temperature determined in accordance with the reduced pressure.

In this manufacturing method, specific values of the reduced pressure and the heating temperature are preferably set to be a pressure that achieves heated detachment at a temperature that does not cause significant deterioration of the piezoelectricity of the piezoelectric substrate. For example, with an LT substrate, the reduced pressure is preferably set to be about 0.1 Pa to about 5000 Pa to achieve a heating temperature of about 350° C. or less, for example, which prevents the deterioration of the piezoelectricity of the piezoelectric substrate.

In the method for manufacturing a piezoelectric device according to various preferred embodiments of the present invention, the reduced pressure is preferably set such that oxygen desorption of the piezoelectric substrate does not occurs at the heating temperature determined in accordance with the reduced pressure.

In this manufacturing method, other specific values of the reduced pressure and the heating temperature are preferably set to be a pressure that achieves heated detachment at a temperature that does not cause oxygen desorption of the piezoelectric substrate. For example, with an LT substrate, the reduced pressure is preferably set to be about $1 \times 10^{-6}$ Pa to about 0.1 Pa to achieve a heating temperature of about 250° C. or less, which prevents oxygen desorption of the piezoelectric substrate.

In the method for manufacturing a piezoelectric device according to various preferred embodiments of the present invention, the heating temperature is preferably set such that a metal defining the electrode does not significantly diffuse into the piezoelectric substrate due to the heating temperature.

In this manufacturing method, a specific value of the heating temperature is set to be a temperature that does not cause the diffusion of a metal from the electrode into the piezoelectric substrate. For example, when an LT substrate is used and the electrode is made of Al, the heating temperature is preferably set to be about 250° C. or less, which prevents the diffusion of a metal defining the electrode into the piezoelectric substrate.

In the method for manufacturing a piezoelectric device according to various preferred embodiments of the present invention, the piezoelectric substrate is preferably of lithium tantalate, for example.

In this manufacturing method, since the piezoelectric substrate is made of lithium tantalate (LiTaO$_3$), there is no degradation of the characteristics described above. Thus, a piezoelectric device having improved characteristics can be formed.

According to various preferred embodiments of the present invention, when an electronic device that includes a crystalline material, such as a piezoelectric device, is manufactured by a smart cut method, the degradation of characteristics caused by performing heating can be prevented and an electronic device having good characteristics can be manufactured. In particular, a piezoelectric device having good characteristics can be manufactured by applying the manufacturing method according to various preferred embodiments of the present invention to a piezoelectric device.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 1 is a flowchart showing a method for manufacturing a thin film piezoelectric device according to preferred embodiments of the present invention.

DETAILED DESCRIPTION OF PREFERRED EMBODIMENTS

A method for manufacturing an electronic device according to preferred embodiments of the present invention will be described with reference to the drawings. In the following description, a thin film piezoelectric device for a Lamb wave that includes a piezoelectric thin film is described as an electronic device that uses a crystalline material.

FIG. 1 is a flowchart showing a method for manufacturing a thin film piezoelectric device according to a preferred embodiment. FIGS. 2 to 4 schematically show the manufacturing processes of the thin film piezoelectric device formed in accordance with the manufacturing flow shown in FIG. 1.

Figure 2A:
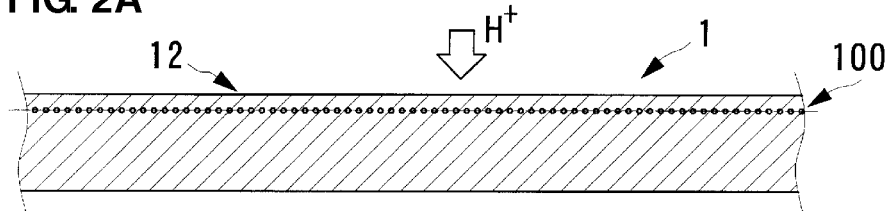
FIGS. 2A to 2E schematically show a manufacturing process of the thin film piezoelectric device formed in accordance with the manufacturing flow shown in FIG. 1.

A piezoelectric single crystal substrate 1 having a desired thickness is prepared. As shown in FIG. 2A, hydrogen ions are implanted from the back surface 12 side to form an ion implantation layer 100 (FIG. 1: S101). A mother substrate on which a plurality of separate thin film piezoelectric devices can be arranged is provided as the piezoelectric single crystal substrate 1. For example, when an LT substrate is used as the piezoelectric single crystal substrate 1, a hydrogen ion layer is preferably formed at a depth of about 1 µm, for example, from the back surface 12 by implanting hydrogen ions preferably at a dose amount of about $1.0 \times 10^{17}$ atom/cm$^2$, for example, with an acceleration energy of about 150 keV, for example. Consequently, the ion implantation layer 100 is formed. Instead of the LT substrate, an LN substrate, a Li$_2$B$_4$O$_7$ (LBO) substrate, or a La$_3$Ga$_5$SiO$_{14}$ (langasite) substrate may preferably be used as the piezoelectric single crystal substrate 1, and ion implantation is performed under conditions that are suitable to each of the substrates.

Figure 2B:
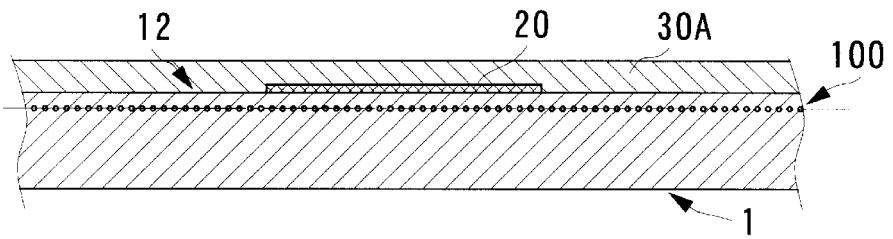

As shown in FIG. 2B, a lower electrode 20 having a desired thickness is formed on the back surface 12 of the piezoelectric single crystal substrate 1 preferably using aluminum (Al) or other suitable material. Furthermore, an adhesive layer 30A is formed on the back surface 12 on which the lower electrode 20 has been formed (FIG. 1: S102). For example, a SiO$_2$ film is preferably used as the adhesive layer 30A, and its surface is preferably planarized by polishing, such as chemical mechanical polishing (CMP), for example.

A supporting substrate 30B is prepared separately. The supporting substrate 30B is made by forming a supporting layer 302B on a mother substrate 301B. Although the mother substrate 301B can be made of a piezoelectric material as with the piezoelectric single crystal substrate 1, Si or glass, for example, that is easily available and inexpensive and has a thermal expansion coefficient different from that of the piezoelectric single crystal substrate 1 but has good thermal resistance may preferably be used. In this preferred embodiment, Si is described. A circuit electrode pattern 50 and the supporting layer 302B preferably made of SiO$_2$, for example, are formed on the surface of the mother substrate 301B made of Si. In addition, by, for example, etching the supporting layer 302B, a depression is formed in the area corresponding to a region at which an IDT electrode described below is to be formed while a through hole is formed in the area corresponding to a portion of the circuit electrode pattern 50. A material for a sacrificial layer is deposited in the depression and the through hole to form sacrificial layers 40A and 40B, and the surface of the supporting layer 302B is preferably planarized by CMP, for example.

Figure 2C:
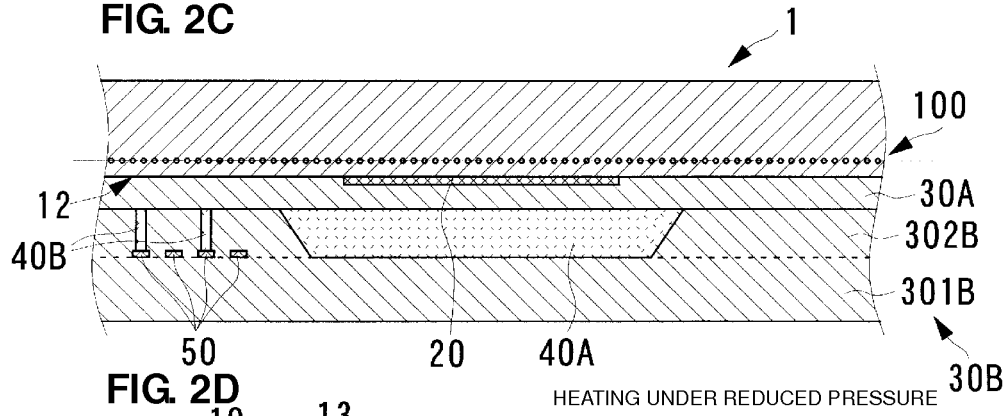

As shown in FIG. 2C, the piezoelectric single crystal substrate 1 is attached to the supporting substrate 30B by directly bonding the supporting layer 302B of the supporting substrate 30B to the surface of the adhesive layer 30A using a surface activated bonding technology (FIG. 1: S103). The surface activated bonding is a method in which bonding is performed while a joint surface is activated by applying Ar ions or other suitable ions under a vacuum pressure. This bonding method does not require the application of heat. Even if coefficients of linear expansion between the piezoelectric single crystal substrate 1 and the adhesive layer 30A and between the supporting layer 302B and the mother substrate 301B of the supporting substrate 30B are different, breakages can be prevented from occurring at each interface because the joint surface is not heated during the surface activated bonding. Furthermore, since heat is not applied to the piezoelectric single crystal substrate 1, the degradation of characteristics caused by heating can be prevented. Moreover, since an OH group is not used unlike in hydrophilic bonding, voids caused by the generation of hydrogen are also prevented.

Figure 2D:
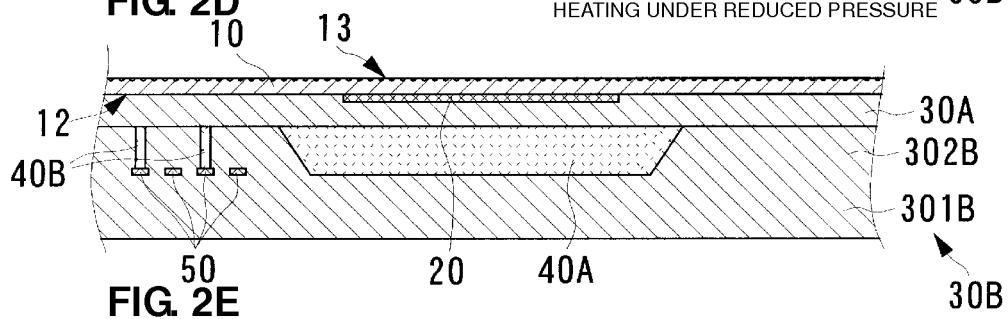

As shown in FIG. 2D, the piezoelectric single crystal substrate 1 to which the supporting substrate 30B is bonded is heated under a reduced pressure to perform detachment using the ion implantation layer 100 as a detaching interface (FIG. 1: S104). As a result, a piezoelectric thin film 10 that is supported by the supporting substrate 30B is formed.

In accordance with the reduced pressure, the heating is conducted only to a temperature less than the temperature at which heating is conducted at atmospheric pressure. Specifically, the reduced pressure and the heating temperature are set based on the following conditions.

Figure 5:
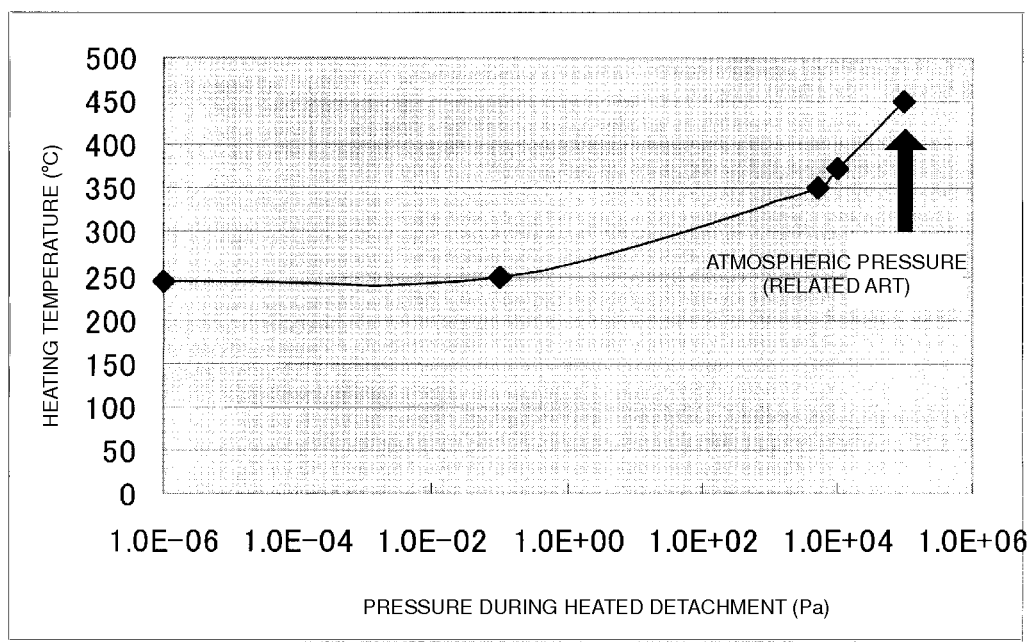
FIG. 5 is a graph showing the transition of detaching temperature determined in accordance with air pressure when heated detachment is performed.

FIG. 5 shows the transition of detaching temperature determined in accordance with air pressure when heated detachment is performed.

As shown in FIG. 5, the detaching temperature is decreased at a reduced pressure that is less than atmospheric pressure. For example, the detaching temperature is about 450° C. at atmospheric pressure, whereas the detaching temperature is about 350° C. at about 5000 Pa. When the pressure is further reduced to about 0.1 Pa, the detaching temperature is decreased to about 250° C., for example.

The decrease in the detaching temperature due to the reduced pressure occurs for the following reasons.

The implanted hydrogen ions are easily gasified at a lower temperature at a reduced pressure than at atmospheric pressure, and the difference between the pressures of the ion implantation layer 100 and the residual layer the piezoelectric single crystal substrate 1 becomes large at a lower temperature. Therefore, the cracking and detachment are facilitated.

With the stress caused during gasification, an electric discharge occurs around the ion implantation layer 100 due to the charge distribution caused by the pyroelectricity of the piezoelectric single crystal substrate 1. This electric discharge more easily occurs at a reduced pressure than at atmospheric pressure, and the cracking of the crystal structure around the ion implantation layer 100 is facilitated due to the electric discharge.

For an LT single crystal or an LN single crystal, the detaching temperature of about 350° C. is less than or equal to its Curie temperature. Thus, the degradation of the piezoelectricity is prevented.

When the detaching temperature is reduced to about 250° C., the insulation of the LT single crystal is prevented from deteriorating while the diffusion of Al defining the lower electrode 20 into the LT single crystal that is the piezoelectric single crystal substrate 1 is prevented. Even when the circuit electrode pattern 50 is formed in the supporting substrate 30B as described above, a metal defining the circuit electrode pattern 50 is prevented from diffusing into the supporting substrate 30B (particularly supporting layer 302B), thus the degradation of the characteristics is prevented.

Since the stress caused by performing heating can be reduced when the heating temperature is reduced, even if the coefficients of linear expansion are different, breakages caused by the stress are prevented. Thus, even a material that has good temperature characteristics and good electric power resistance but has a thermal expansion coefficient different from that of the piezoelectric single crystal substrate 1 can be used for a supporting substrate. Since the use of a wide variety of supporting substrates is possible, a less expensive supporting substrate can be selected.

In such a heating step, the temperature is not rapidly increased or decreased, and needs to be gradually increased or decreased. Therefore, the throughput in the heating step can be increased by decreasing the heating temperature. In this case, pressure reducing treatment needs to be performed, which is not required for heated detachment that is conducted at atmospheric pressure. However, since the time required for reducing and increasing pressure is less than the time required for decreasing and increasing temperature, the throughput in the heating step can be increased as compared to that in the existing heating step, thus productivity can be improved.

Figure 2E:
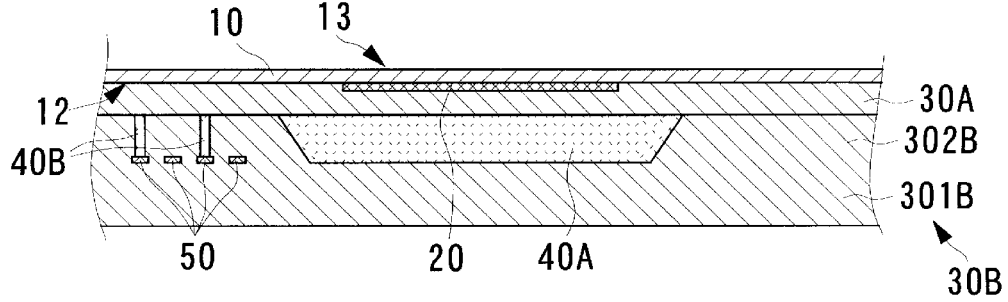

As shown in FIG. 2E, a detaching interface 13 of the piezoelectric thin film 10 is preferably polished to a mirror-smooth state by CMP or other suitable method (FIG. 1: S105). Such mirror finish of the surface 13 improves the characteristics of a piezoelectric device.

Figure 3A:
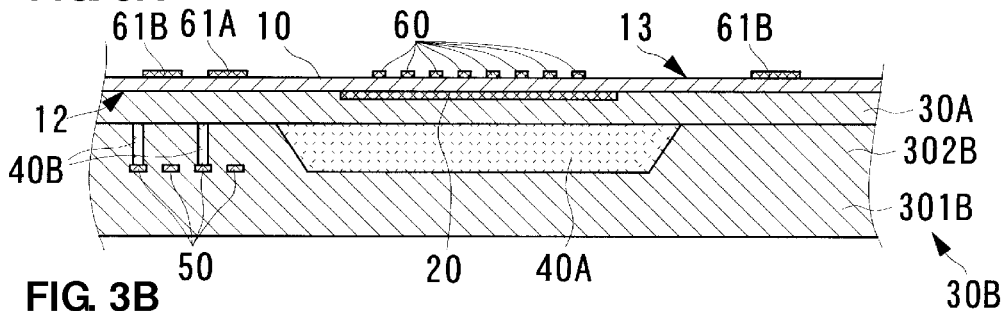
FIGS. 3A to 3E schematically show a manufacturing process of the thin film piezoelectric device formed in accordance with the manufacturing flow shown in FIG. 1.

As shown in FIG. 3A, a surface electrode pattern including an IDT electrode 60 defining an excitation electrode of a Lamb wave device, a wiring electrode 61A, and a bump pad 61B is formed on the surface 13 of the piezoelectric thin film 10 (FIG. 1: S106).

Figure 3B:
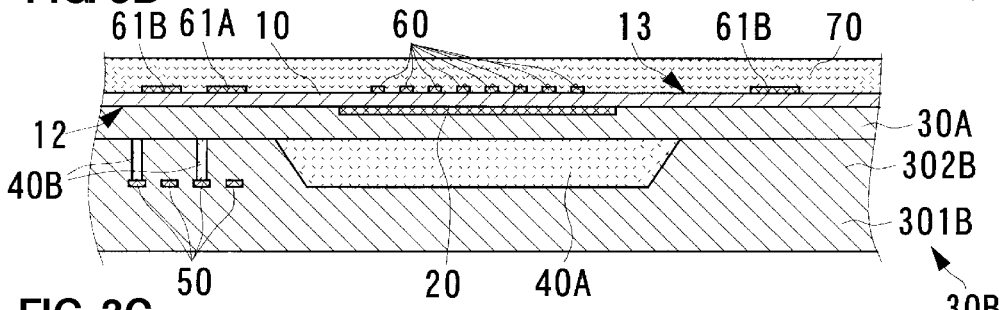
Figure 3C:
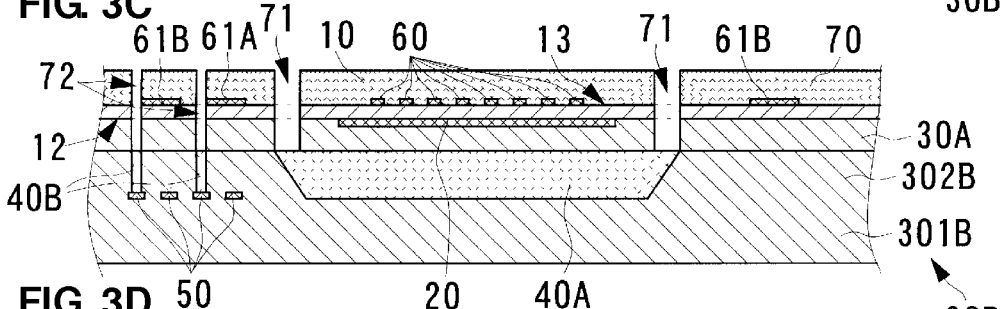

As shown in FIG. 3B, a resist film 70 is formed on the surface 13 of the piezoelectric thin film 10 on which the upper electrode pattern has been formed (FIG. 1: S107). As shown in FIG. 3C, etching windows 71 and 72 for removing the sacrificial layers 40A and 40B are formed in the resist film 70 preferably by photolithography, for example (FIG. 1: S108).

Figure 3D:
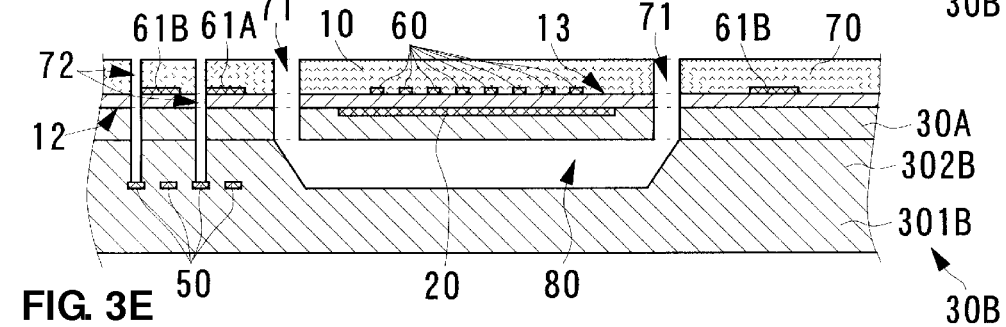
Figure 3E:
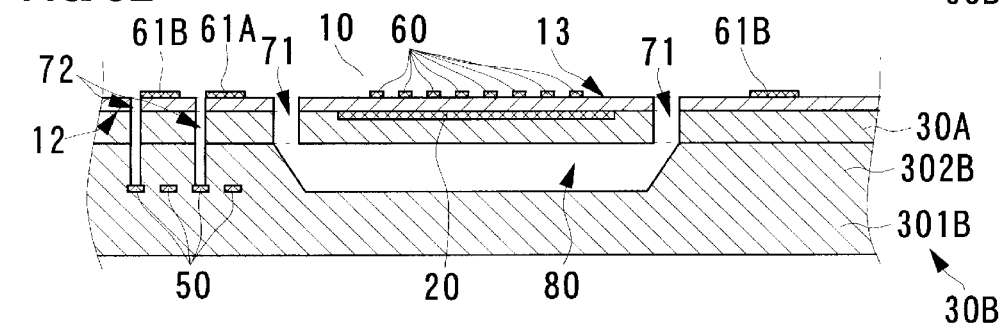

As shown in FIG. 3D, the sacrificial layers 40A and 40B are removed by introducing an etching solution or an etching gas into the etching window 71. As a result, the space in which the sacrificial layer 40A was formed and that corresponds to the region at which the lower electrode 20 and the IDT electrode 60 of a single thin film piezoelectric device are formed is changed to a depletion layer 80 (FIG. 1: S109). After the removal of the sacrificial layers 40A and 40B, the resist film 70 is removed as shown in FIG. 3E (FIG. 1: S110).

Figure 4A:
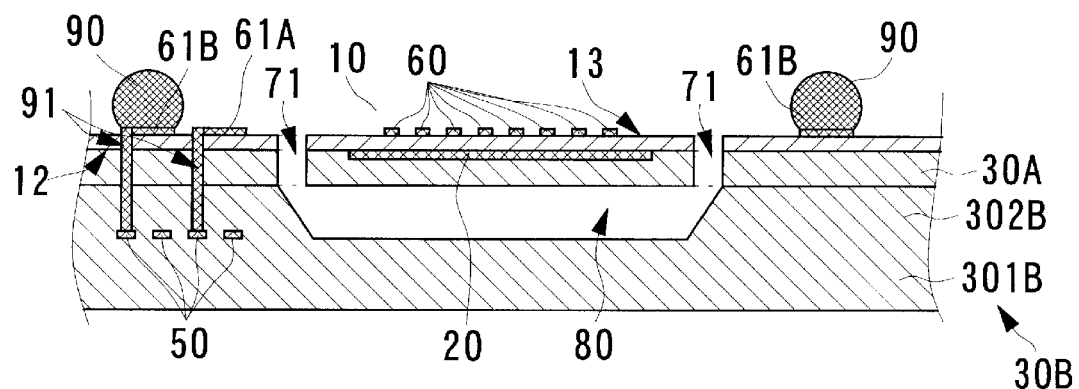
FIGS. 4A and 4B schematically show a manufacturing process of the thin film piezoelectric device formed in accordance with the manufacturing flow shown in FIG. 1.
Figure 4B:
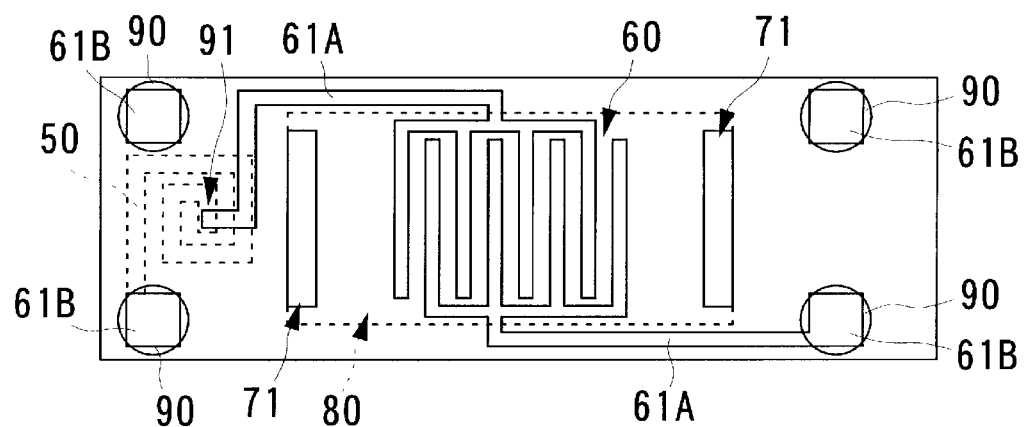

As shown in FIG. 4A, through hole electrodes 91 that connect the circuit electrode pattern 50 to the wiring electrode 61A and the bump pad 61B are formed as an upper electrode for completing a thin film piezoelectric device while a bump 90 is formed on the bump pad 61B (FIG. 1: S111). As shown in FIG. 4B, the mother substrate is then cut into individual thin film piezoelectric devices. Thus, a thin film piezoelectric device is formed.

In the manufacturing method according to this preferred embodiment, that is, a method including a step of performing heated detachment at a reduced pressure and at a low temperature determined in accordance with the reduced pressure, the problems that arise when the known smart-cut method is used are overcome and a thin film piezoelectric device having good characteristics and properties can be manufactured.

In other words, the degradation of the piezoelectricity and insulation is prevented, and a thin film piezoelectric device having good piezoelectricity can be manufactured. Even if an electrode is formed on the surface of a piezoelectric thin film, a metallic element of the electrode is prevented from diffusing into the piezoelectric thin film, and a thin film piezoelectric device with low transmission loss can be manufactured. Since a supporting substrate having a coefficient of linear expansion different from that of the piezoelectric thin film can be used, there is no constraint on the material which can be used for the supporting substrate and the supporting substrate can be easily designed with low cost. Furthermore, the throughput in a heated detachment step is improved and the productivity can be increased, accordingly.

In the description provided above, a method for manufacturing a Lamb wave device has been described. However, the manufacturing method according to various preferred embodiments of the present invention can also be applied to a SAW device, an F-BAR device, a gyro, a radio frequency (RF) switch, and other suitable devices that use a different piezoelectric thin film. The manufacturing method according to various preferred embodiments can further be applied to a pyroelectric device and other crystalline devices.

In the description provided above, a thin film piezoelectric device having a lower electrode has been described. However, the manufacturing method according to various preferred embodiments can be applied to a thin film piezoelectric device which does not include a lower electrode.

While preferred embodiments of the invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing a piezoelectric device comprising:
    a step of forming an ion implantation layer by implanting ions into a piezoelectric substrate;
    a step of forming an adhesive layer on the piezoelectric substrate;
    a step of forming a supporting body on the piezoelectric substrate in which the ion implantation layer has been formed; and
    a step of detaching a layer of the piezoelectric substrate in which the ion implantation layer has been formed to form a piezoelectric thin film by heating the piezoelectric substrate; wherein
    the piezoelectric substrate is composed of lithium tantalate;
    in the step of detaching the layer of the piezoelectric substrate to form the piezoelectric thin film, the piezoelectric substrate in which the ion implantation layer has been formed is heated at a reduced pressure less than atmospheric pressure of about 5000 Pa or less and at a heating temperature of about 350° C. or less; and
    the adhesive layer is directly bonded to an adhesive surface of the supporting body by a surface activated bonding method in which bonding is performed while a joint surface of the adhesive layer adjacent to the adhesive surface of the supporting body is activated by applying ions under a vacuum pressure.

2. The method for manufacturing a piezoelectric device according to claim 1, wherein
    the supporting body is formed on a side on which the piezoelectric thin film is to be formed using the ion implantation layer; and
    in the step of detaching the layer of the piezoelectric substrate to form the piezoelectric thin film, the piezoelectric substrate on which the supporting body has been formed is heated at the reduced pressure and at the heating temperature determined in accordance with the reduced pressure.

3. The method for manufacturing a piezoelectric device according to claim 1, wherein the piezoelectric substrate has a coefficient of linear expansion different from that of the supporting body.

4. The method for manufacturing a piezoelectric device according to claim 1, wherein the supporting body is made of a material having good thermal conductivity to the piezoelectric substrate.

5. The method for manufacturing a piezoelectric device according to claim 1, further comprising, before the step of directly bonding the adhesive layer to the adhesive surface of the supporting body, a step of forming an electrode on at least one of a surface of the piezoelectric substrate located on a side on which the piezoelectric thin film is to be formed and a surface of the supporting body to which the piezoelectric substrate is to be bonded.

6. The method for manufacturing a piezoelectric device according to claim 5, wherein the heating temperature at the reduced pressure is set such that a metal defining the electrode does not significantly diffuse into the piezoelectric substrate due to the heating temperature.

7. The method for manufacturing a piezoelectric device according to claim 1, wherein the reduced pressure is set such that piezoelectricity of the piezoelectric substrate is not significantly deteriorated at the heating temperature determined in accordance with the reduced pressure.

8. The method for manufacturing a piezoelectric device according to claim 1, wherein the reduced pressure is set such that oxygen desorption of the piezoelectric substrate does not significantly occur at the heating temperature determined in accordance with the reduced pressure.

9. A method for manufacturing a piezoelectric device comprising:
    a step of forming an ion implantation layer by implanting ions into a piezoelectric substrate;
    a step of forming an adhesive layer on the piezoelectric substrate;
    a step of forming a supporting body on the piezoelectric substrate in which the ion implantation layer has been formed; and
    a step of detaching a layer of the piezoelectric substrate in which the ion implantation layer has been formed to form a piezoelectric thin film by heating the piezoelectric substrate; wherein
    the piezoelectric substrate is composed of lithium tantalate single crystal or lithium niobate single crystal;
    in the step of detaching the layer of the piezoelectric substrate to form the piezoelectric thin film, the piezoelectric substrate in which the ion implantation layer has been formed is heated at a reduced pressure less than atmospheric pressure of about 0.1 Pa or less and at a heating temperature of about 250° C. or less; and
    the adhesive layer is directly bonded to an adhesive surface of the supporting body by a surface activated bonding method in which bonding is performed while a joint surface of the adhesive layer adjacent to the adhesive surface of the supporting body is activated by applying ions under a vacuum pressure.

10. The method for manufacturing a piezoelectric device according to claim 9, wherein
    the supporting body is formed on a side on which the piezoelectric thin film is to be formed using the ion implantation layer; wherein
    in the step of detaching the layer of the piezoelectric substrate to form the piezoelectric thin film, the piezoelectric substrate on which the supporting body has been formed is heated at the reduced pressure and at the heating temperature determined in accordance with the reduced pressure.

11. The method for manufacturing a piezoelectric device according to claim 9, wherein the piezoelectric substrate has a coefficient of linear expansion different from that of the supporting body.

12. The method for manufacturing a piezoelectric device according to claim 9, wherein the supporting body is made of a material having good thermal conductivity to the piezoelectric substrate.

13. The method for manufacturing a piezoelectric device according to claim 9, further comprising, before the step of directly bonding the adhesive layer to the adhesive surface of the supporting body, a step of forming an electrode on at least one of a surface of the piezoelectric substrate located on a side on which the piezoelectric thin film is to be formed and a surface of the supporting body to which the piezoelectric substrate is to be bonded.

14. The method for manufacturing a piezoelectric device according to claim 13, wherein the heating temperature at the reduced pressure is set such that a metal defining the electrode does not significantly diffuse into the piezoelectric substrate due to the heating temperature.

15. The method for manufacturing a piezoelectric device according to claim 9, wherein the reduced pressure is set such that piezoelectricity of the piezoelectric substrate is not significantly deteriorated at the heating temperature determined in accordance with the reduced pressure.

16. The method for manufacturing a piezoelectric device according to claim 9, wherein the reduced pressure is set such that oxygen desorption of the piezoelectric substrate does not significantly occur at the heating temperature determined in accordance with the reduced pressure.

\* \* \* \* \*